United States Patent
Park et al.

(10) Patent No.: US 8,120,005 B2
(45) Date of Patent: Feb. 21, 2012

(54) PHASE CHANGE MEMORY DEVICES AND THEIR METHODS OF FABRICATION

(75) Inventors: Jae-Hyun Park, Gyeonggi-do (KR); Jae-Hee Oh, Gyeonggi-do (KR); Se-Ho Lee, Seoul (KR); Won-Cheol Jeong, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/544,104

(22) Filed: Aug. 19, 2009

(65) Prior Publication Data

US 2009/0302297 A1     Dec. 10, 2009

Related U.S. Application Data

(62) Division of application No. 11/392,310, filed on Mar. 28, 2006, now Pat. No. 7,598,112.

(30) Foreign Application Priority Data

Apr. 20, 2005   (KR) .................................. 2005-32898

(51) Int. Cl.
*H01L 45/00*     (2006.01)

(52) U.S. Cl. .. 257/4; 257/2; 257/3; 257/5; 257/E45.002; 438/95; 438/102; 438/103

(58) Field of Classification Search .................. 257/2–5, 257/E45.002; 438/95, 102, 103, 131, 900
See application file for complete search history.

(56) References Cited

U.S. PATENT DOCUMENTS

| | | | |
|---|---|---|---|
| 6,236,059 | B1 | 5/2001 | Wolstenholme et al. |
| 6,348,365 | B1 | 2/2002 | Moore et al. |
| 6,511,862 | B2 | 1/2003 | Hudgens et al. |
| 6,607,974 | B2 | 8/2003 | Harshfield |
| 6,653,733 | B1 | 11/2003 | Gonzalez et al. |
| 6,750,101 | B2 | 6/2004 | Lung |

(Continued)

FOREIGN PATENT DOCUMENTS

| KR | 2005-0015564 | 2/2005 |
|---|---|---|
| WO | WO 2004/090984 | 10/2004 |
| WO | WO 2005/096380 | 10/2005 |

OTHER PUBLICATIONS

English language (machine translation) of Korean Publication No. 2005-0015564.

(Continued)

*Primary Examiner* — Ha Tran T Nguyen
*Assistant Examiner* — Suberr Chi
(74) *Attorney, Agent, or Firm* — F. Chau & Associates, LLC

(57) ABSTRACT

In an embodiment, a phase change memory device includes a semiconductor substrate of a first conductivity type and a first interlayer insulating layer disposed on the semiconductor substrate. A hole penetrates the first interlayer insulating layer. A first and a second semiconductor pattern are sequentially stacked in a lower region of the hole. A cell electrode is provided on the second semiconductor pattern. The cell electrode has a lower surface than a top surface of the first interlayer insulating layer. A confined phase change material pattern fills the hole on the cell electrode. An upper electrode is disposed on the phase change material pattern. The phase change material pattern in the hole is self-aligned with the first and second semiconductor patterns by the hole. A method of fabricating the phase change memory device is also provided.

20 Claims, 7 Drawing Sheets

U.S. PATENT DOCUMENTS

| | | | |
|---|---|---|---|
| 6,774,388 B2 | 8/2004 | Hudgens et al. | |
| 2002/0086524 A1 | 7/2002 | Harshfield | |
| 2003/0001211 A1* | 1/2003 | Hudgens et al. | 257/355 |
| 2003/0073262 A1 | 4/2003 | Xu et al. | |
| 2005/0263801 A1 | 12/2005 | Park et al. | |
| 2005/0263829 A1* | 12/2005 | Song et al. | 257/379 |
| 2005/0270832 A1 | 12/2005 | Chu et al. | |
| 2006/0097238 A1* | 5/2006 | Breuil et al. | 257/4 |
| 2006/0186483 A1* | 8/2006 | Cho et al. | 257/390 |
| 2006/0257787 A1 | 11/2006 | Kuo et al. | |

OTHER PUBLICATIONS

Bez, R., Pirovano, A., Non-volatile memory technologies: emerging concepts and new materials, 2004, Materials, Science in Semiconductor Processing, vol. 7, pp. 349-355.

Lacaita, A.L., Phase change memories: State-of-the-art, challenges and perspectives, 2006, Solid State Electronics, vol. 50, pp. 24-31.

Office Action of the IPO issued Sep. 10, 2008 in ROC (Taiwan) Patent Application No. 095114046.

* cited by examiner

PHASE CHANGE MEMORY DEVICES AND THEIR METHODS OF FABRICATION

CROSS-REFERENCE TO RELATED APPLICATION

This application is a Divisional of U.S. patent application Ser. No. 11/392,310, filed on Mar. 28, 2006, now U.S. Pat. No. 7,598,112, which claims priority under 35U.S.C. §119 from Korean Patent Application No. 10-2005-0032898, filed Apr. 20, 2005, in the Korean Intellectual Property Office, the entire contents of which are hereby incorporated by reference

FIELD OF THE INVENTION

The present invention relates to semiconductor memory devices and their methods of fabrication, and, more particularly, to phase change memory devices having cell diodes and their methods of fabrication.

BACKGROUND

Nonvolatile memory devices retain their stored data even when their power supplies are turned off. Thus, nonvolatile memory devices have been widely used in conjunction with computers, mobile telecommunication systems, memory cards and so on. For example, one widely used type of nonvolatile memory device is the flash memory device. Many flash memory devices employ memory cells having a stacked gate structure. The stacked gate structure of a flash memory device typically includes a tunnel oxide layer, a floating gate, an inter-gate dielectric layer, and a control gate electrode, which are sequentially stacked on a channel region.

Recently, other types of nonvolatile memory devices, for example, phase change memory devices are being used in place of flash memory devices. A unit cell of a phase change memory device includes a cell switching device and a phase change resistor electrically connected to the cell switching device, and the phase change resistor includes an upper electrode and a lower electrode as well as a phase change material layer between the upper and lower electrodes. The cell switching device may be an active device such as a MOS transistor. In this case, a large program current of at least a few milli-ampere (mA) is required to program the phase change memory cell, and the program current is supplied through the cell's MOS transistor. Accordingly, this may cause a limitation in reducing the area that the cell's MOS transistor occupies. In other words, when a MOS transistor is employed as the switching device of the phase change memory cell, it may be difficult to enhance the integration density of the phase change memory device.

To solve this problem, a vertical diode has been employed as the cell switching device of the phase change memory device. A phase change memory cell having the vertical diode is disclosed, for example, in U.S. Pat. No. 6,511,862 B2 to Hudgens, et al., entitled "Modified Contact for Programmable Devices." According to Hudgens, et al., an isolation layer is formed in a predetermined region of a semiconductor substrate to define an active region, and a word line and a vertical cell diode are formed in the active region. A contact such as a metal silicide layer is then formed on the vertical cell diode, and an insulating layer is formed on the substrate having the contact. The insulating layer is patterned to form an opening that exposes the contact, and a spacer and a confined programmable material layer (i.e., a confined phase change material layer) are formed in the opening.

As a result of manufacturing this configuration, the opening may be misaligned with the vertical cell diode, which would cause the phase change material layer to be in direct contact with the metal silicide layer. The metal silicide layer may then react with the phase change material layer during a subsequent annealing process, thereby degrading the properties of the phase change material layer. Thus, there may still be a limitation in reducing the phase change memory cell size.

SUMMARY

In one aspect of the present invention, a phase change memory device having cell diodes is provided. The phase change memory device may include a semiconductor substrate of a first conductivity type and a first interlayer insulating layer on the semiconductor substrate. A hole in the first interlayer insulating layer is provided. A first semiconductor pattern and a second semiconductor pattern are sequentially stacked in a lower region of the hole. A cell electrode is provided on the second semiconductor pattern. The cell electrode has a top surface lower than a top surface of the first interlayer insulating layer. A confined phase change material pattern filling the hole is provided on the cell electrode. An upper electrode is provided on the confined phase change material pattern. The confined phase change material pattern in the hole is self-aligned with the first and second semiconductor patterns by the hole.

In some embodiments, a word line may be provided between the first interlayer insulating layer and the semiconductor substrate, and a sidewall of the word line may be surrounded by a word line separation layer. In this case, the hole may expose a predetermined region of the word line. The word line may have a second conductivity type different from the first conductivity type. The first and second conductivity types may be a P-type and an N-type, respectively.

In other embodiments, the first semiconductor pattern may have the first conductivity type or a second conductivity type different from the first conductivity type, and the second semiconductor pattern may have the first conductivity type.

In yet other embodiments, the first interlayer insulating layer may be a single insulating layer.

In still other embodiments, the cell electrode may be a metal silicide layer.

In still other embodiments, an insulating contact spacer may be provided between the confined phase change material pattern in the hole and a sidewall of the hole. The insulating contact spacer may be in contact with an edge of the cell electrode. A lower electrode may be provided between the confined phase change material pattern and the cell electrode. The lower electrode may be a titanium nitride layer or a titanium aluminum nitride layer.

In further embodiments, the semiconductor substrate having the upper electrode may be covered with a second interlayer insulating layer, and a bit line may be disposed on the second interlayer insulating layer. The bit line may be electrically connected to the upper electrode through a bit line contact hole that penetrates the second interlayer insulating layer.

In another aspect, a method of fabricating phase change memory devices having cell diodes is provided. The method includes preparing a semiconductor substrate of a first conductivity type and forming a first interlayer insulating layer on the semiconductor substrate. The first interlayer insulating layer is patterned to form a plurality of holes that penetrate the first interlayer insulating layer. First semiconductor patterns and second semiconductor patterns, which are sequentially stacked, are formed in lower regions of the holes. Cell electrodes are formed on the second semiconductor patterns. Phase change material patterns and upper electrodes, which are sequentially stacked, are formed on the cell electrodes. The phase change material patterns fill the holes.

In some embodiments of the present invention, a plurality of parallel word lines between the first interlayer insulating layer and the semiconductor substrate as well as a word line separation layer between the word lines may be formed prior to formation of the first interlayer insulating layer. In this case, the holes may be formed to expose predetermined regions of the word lines. The formation of the word lines and the word line separation layer may include etching the semiconductor substrate to form a trench isolation region that define a plurality of parallel active regions, forming an isolation layer filling the trench isolation region and implanting impurity ions of a second conductivity type different from the first conductivity type into the active regions to form impurity regions of the second conductivity type. The first conductivity type may be a P-type, and the second conductivity type may be an N-type.

In other embodiments, the first interlayer insulating layer may be a single insulating layer.

In yet other embodiments, the first semiconductor patterns maybe formed to have the first conductivity type or a second conductivity type different from the first conductivity type, and the second semiconductor patterns may be formed to have the first conductivity type. The formation of the first and second semiconductor patterns may include forming recessed semiconductor patterns filling lower regions in the holes, doping lower regions of the recessed semiconductor patterns with impurities of the first or second conductivity type and doping upper regions of the recessed semiconductor patterns with impurities of the first conductivity type. The formation of the recessed semiconductor patterns may include forming a single crystalline semiconductor layer filling the holes using a selective epitaxial growth technique, planarizing the single crystalline semiconductor layer to form single crystalline semiconductor patterns with flat top surfaces having the same level as a top surface of the first interlayer insulating layer, and partially etching the single crystalline semiconductor patterns to recess the single crystalline semiconductor patterns.

In still other embodiments, the cell electrodes may be formed of a metal silicide layer. The metal silicide layer may be formed using a salicide technique. The metal silicide layer may be formed of a cobalt silicide layer, a nickel silicide layer or a titanium silicide layer.

In yet still other embodiments, insulating contact spacers may be formed on sidewalls of the holes on the cell electrodes prior to formation of the confined phase change material patterns and the upper electrodes. Lower electrodes may be formed on the cell electrodes exposed by the insulating contact spacers prior to formation of the confined phase change material patterns and the upper electrodes. The lower electrodes may be formed to have top surfaces which are lower than a top surface of the first interlayer insulating layer.

In further embodiments, the formation of confined phase change material patterns and the upper electrodes may include sequentially forming a phase change material layer and an upper electrode layer on the semiconductor substrate having the cell electrodes, and patterning the upper electrode layer and the phase change material layer. The phase change material layer may be formed of a chalcogenide layer, and the upper electrode layer may be formed of a titanium nitride layer or a titanium aluminum nitride layer.

In yet further embodiments, a second interlayer insulating layer may be formed on the semiconductor substrate having the upper electrodes, and the second interlayer insulating layer may be patterned to form bit line contact holes that expose the upper electrodes. In addition, a plurality of parallel bit lines, which are electrically connected to the upper electrodes through the bit line contact holes, may be formed on the second interlayer insulating layer.

BRIEF DESCRIPTION OF THE DRAWINGS

The features and advantages of the invention will be apparent from the descriptions of exemplary embodiments of the invention, as illustrated in the accompanying drawings. The drawings are not necessarily to scale, emphasis instead being placed upon illustrating the principles of the invention.

DETAILED DESCRIPTION

Figure 1:
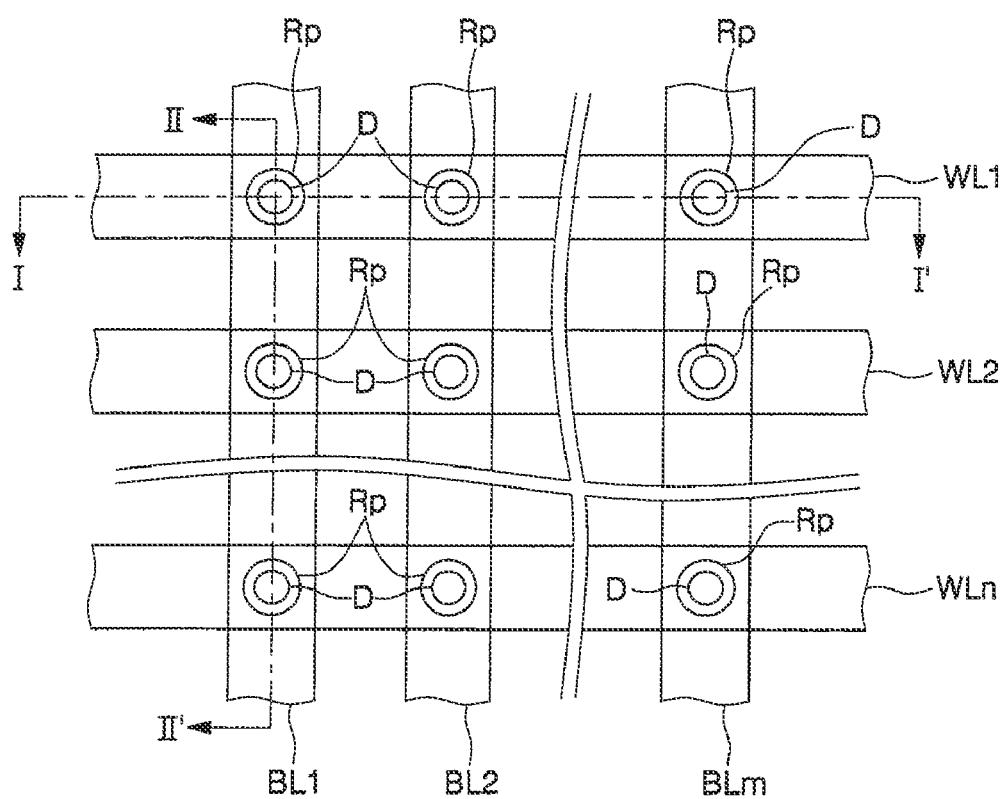
FIG. 1 is a plan view illustrating a portion of a cell array region of a phase change memory device according to an exemplary embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

FIG. 1 is a plan view illustrating a portion of a cell array region of a phase change memory device according to an exemplary embodiment of the present invention. Also, FIGS. 2A, 3A, 4A, 5A, 6A and 7A are cross-sectional views taken along line I-I' of FIG. 1, and FIGS. 2B, 3B, 4B, 5B, 6B and 7B are cross-sectional views taken along line II-II' of FIG. 1.

First, phase change memory devices according to an exemplary embodiment of the present invention will be described with reference to FIGS. 1, 7A and 7B.

Figure 7A:
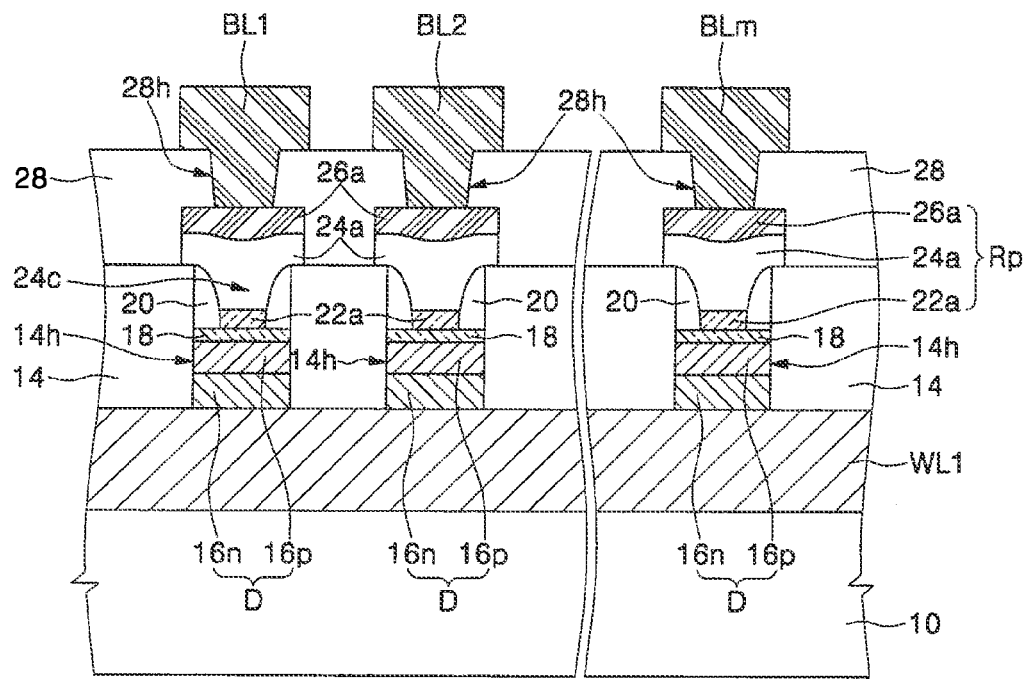
Figure 7B:
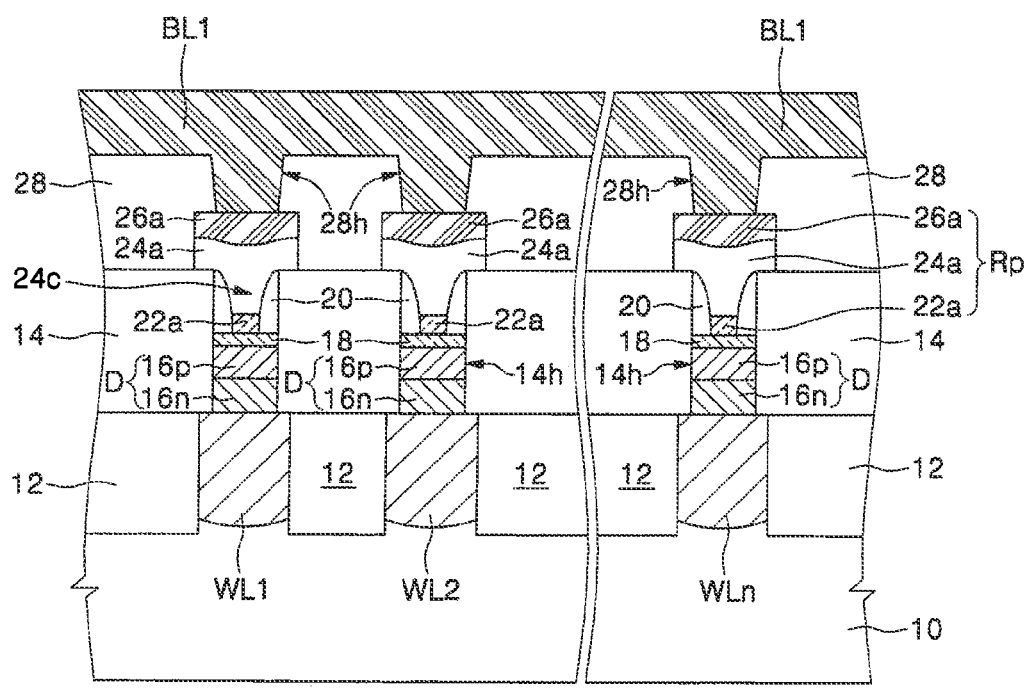

Referring to FIGS. 1, 7A and 7B, a plurality of word lines, for example, n-number of word lines WL1, WL2, . . . , and WLn may be provided on predetermined regions of a semiconductor substrate 10 of a first conductivity type. The word lines WL1, WL2, . . . , and WLn may be substantially parallel to one another. Gap regions between the word lines WL1, WL2, . . . , and WLn may be filled with a word line separation layer 12. The word line separation layer 12 may be a trench isolation layer formed in a predetermined region of the semiconductor substrate 10. In this case, the word lines WL1, WL2, . . . , and WLn may each be provided in a plurality of active regions that are defined by the trench isolation layer. The word lines WL1, WL2, . . . , and WLn may have a second conductivity type different from the first conductivity type. In the embodiment described herein, for the purpose of ease and convenience in explanation, it is assumed that the first and second conductivity types are a P-type and an N-type, respectively. However, the first and second conductivity types may be an N-type and a P-type, respectively.

A first interlayer insulating layer 14 is provided on the semiconductor substrate 10 having the word lines WL1, WL2, ..., and WLn and the word line separation layer 12. The first interlayer insulating layer 14 may be a single layer of insulating material. Predetermined regions of the word lines WL1, WL2, ..., and WLn are exposed by a plurality of cell diode holes 14h passing through the first interlayer insulating layer 14. Even though the term "cell diode hole" is used herein, the hole is not limited to a use with a cell diode in this or any other embodiment of the invention. A lower region in each cell diode hole 14h may be filled with a first semiconductor pattern 16n and a second semiconductor pattern 16p, which are sequentially stacked. The second semiconductor patterns 16p may have the first conductivity type, and the first semiconductor patterns 16n may have the first conductivity type or the second conductivity type. When the first semiconductor patterns 16n have the second conductivity type, the first and second semiconductor patterns 16n and 16p, which are stacked in each of the cell diode holes 14h, constitute a cell diode D. Alternatively, when all of the first and second semiconductor patterns 16n and 16p have the first conductivity type, the first semiconductor patterns 16n and the word lines WL1, WL2, ..., and WLn constitute the cell diodes D.

Even though the first semiconductor patterns 16n have one of the first and second conductivity types, the first semiconductor patterns 16n may have an impurity concentration which is lower than those of the word lines WL1, WL2, ..., and WLn and the second semiconductor patterns 16p. This is for improving the leakage current characteristics of the cell diodes D when the cell diodes D are reverse-biased.

Cell diode electrodes 18 may be provided on the second semiconductor patterns 16p. Even though the term "cell diode electrode" is used herein, the electrode is not limited to a use with a cell diode in this or any other embodiment of the invention. The cell diode electrodes 18 may be a metal silicide layer, such as a cobalt silicide layer. The cell diode electrodes 18 have top surfaces that are lower than a top surface of the first interlayer insulating layer 14. The portion of the cell diode holes 14h above the cell diode electrodes 18 are filled with phase change material patterns 24a. As a result, the phase change material patterns 24a may have a confined shape.

The confined phase change material patterns 24a may have top surfaces that are higher than the top surface of the first interlayer insulating layer 14. Also, the confined phase change material patterns 24a may extend onto the first interlayer insulating layer 14 along a horizontal direction. The confined phase change material patterns 24a may be a chalcogenide layer such as a germanium stibium tellurium (GST) layer. The confined phase change material patterns 24a in the cell diode holes 14h (i.e., lower regions 24c of the confined phase change material patterns 24a) may be self-aligned with the first and second semiconductor patterns 16n and 16p by the cell diode holes 14h. Thus, according to the present embodiments, areas occupied by the phase change memory cells, including the cell diodes D and the phase change material patterns 24a, may be decreased as compared to the conventional art.

Upper electrodes 26a are provided on the confined phase change material patterns 24a, respectively. The upper electrodes 26a may be a conductive layer that does not react with the confined phase change material patterns 24a, such as a metal layer, including, for example, a titanium nitride layer or a titanium aluminum nitride layer.

In other embodiments, insulating contact spacers 20 may be provided between the phase change material patterns 24a in the cell diode holes 14h and sidewalls of the cell diode holes 14h. In this case, contact areas between the phase change material patterns 24a and the cell diode electrodes 18 may decrease due to the presence of the insulating contact spacers 20. Thus, when program current flows through the cell diodes D and the phase change material patterns 24a, phase change efficiency of the phase change material patterns 24a may be improved. In other words, heat generating efficiency at interfaces between the cell diode electrodes 18 and the phase change material patterns 24a may increase, thereby reducing the required program current.

When the phase change material patterns 24a are in direct contact with the cell diode electrodes 18, the phase change material patterns 24a may react with the cell diode electrodes 18 during a subsequent annealing process. In this case, the property of the phase change material patterns 24a may be degraded to reduce the program efficiency and read margin of the phase change memory cell. Accordingly, lower electrodes 22a may be provided between the phase change material patterns 24a and the cell diode electrodes 18. The lower electrodes 22a may be a conductive layer that does not react with the phase change material patterns 24a, such as a titanium nitride (TiN) layer or a titanium aluminum nitride (TiAlN) layer. As a result, the lower electrodes 22a may function as thermally stable heaters. The lower electrode 22a, the phase change material pattern 24a and the upper electrode 26a, which are sequentially stacked on each of the cell diode electrodes 18, constitute a phase change resistor Rp.

A second interlayer insulating layer 28 is provided on the phase change resistors Rp and the first interlayer insulating layer 14. A plurality of bit lines, for example, m-number of bit lines BL1, BL2, ..., and BLm are disposed on the second interlayer insulating layer 28. The bit lines BL1, BL2, ..., and BLm are electrically connected to the upper electrodes 26a through bit line contact holes 28h that penetrate the second interlayer insulating layer 28. The bit lines BL1, BL2, ..., and BLm cross over the word lines WL1, WL2, ..., and WLn.

Now, methods of fabricating phase change memory devices according to an exemplary embodiment of the present invention will be described.

Figure 2A:
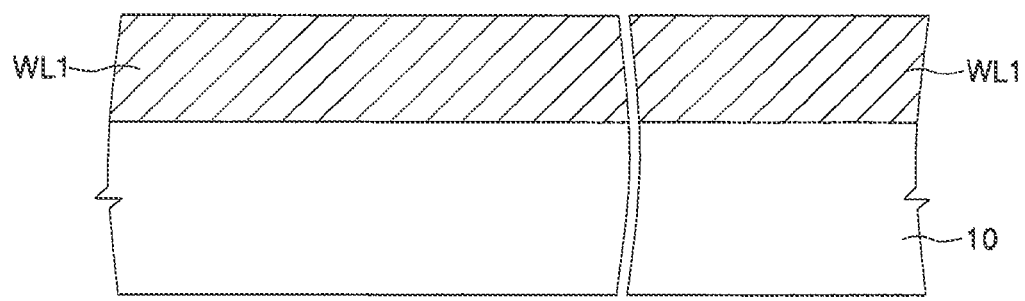
FIGS. 2A, 3A, 4A, 5A, 6A and 7A are cross-sectional views taken along line I-I' of FIG. 1 to illustrate phase change memory devices according to an exemplary embodiment of the present invention and methods of their fabrication.
Figure 2B:
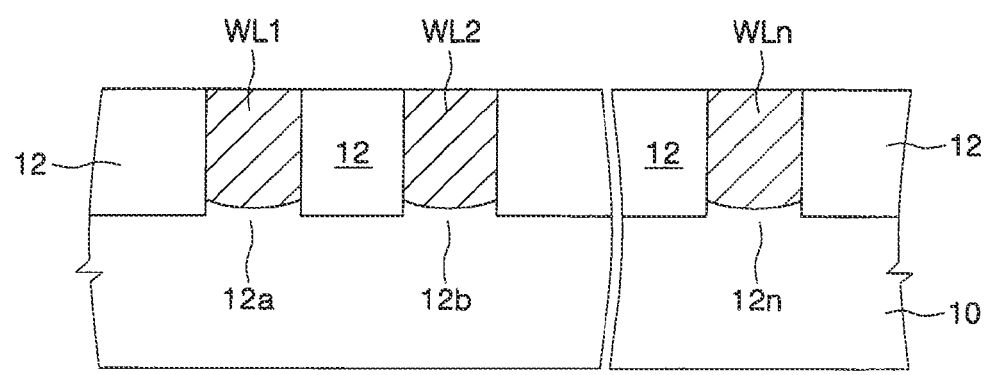
FIGS. 2B, 3B, 4B, 5B, 6B and 7B are cross-sectional views taken along line II-II' of FIG. 1 to illustrate phase change memory devices according to an exemplary embodiment of the present invention and methods of their fabrication.

Referring to FIGS. 1, 2A and 2B, a predetermined region of a semiconductor substrate 10 of a first conductivity type is etched to form a trench isolation region defining a plurality of active regions. An isolation layer 12 is formed to fill the trench isolation region. The plurality of active regions may be n-number of active regions 12a, 12b, ..., and 12n. The active regions 12a, 12b, ..., and 12n may be defined to be substantially parallel to one another. Impurity ions of a second conductivity type different from the first conductivity type are implanted into the active regions 12a, 12b, ..., and 12n, thereby forming impurity regions having the second conductivity type, i.e., n-number of word lines WL1, WL2, ..., and WLn having the second type conductivity. As a result, the trench isolation layer 12 serves as a word line separation layer which electrically insulates the word lines WL1, WL2, ..., and WLn from one another. The first and second conductivity types may be a P-type and an N-type, respectively. Alternatively, the first and second conductivity types may be an N-type and a P-type, respectively.

The method of forming the word lines WL1, WL2, ..., and WLn and the word line separation layer 12 is not limited to the above-described manner including the trench isolation technique and ion implantation technique. That is, the word lines WL1, WL2, ..., and WLn and the word line separation layer 12 may be formed using various other methods. For example, the word lines WL1, WL2, ..., and WLn and the word line separation layer 12 may be formed using an epitaxial growth technique. In detail, an epitaxial semiconductor layer is grown on the semiconductor substrate 10 of the first conductivity type, and the epitaxial semiconductor layer is patterned to form a trench region that defines a plurality of parallel epitaxial semiconductor patterns. An insulating layer is then formed in the trench region to form the word line separation layer 12, and the epitaxial semiconductor patterns are doped with impurities of the second conductivity type to form the word lines WL1, WL2, . . . , and WLn.

Figure 3A:
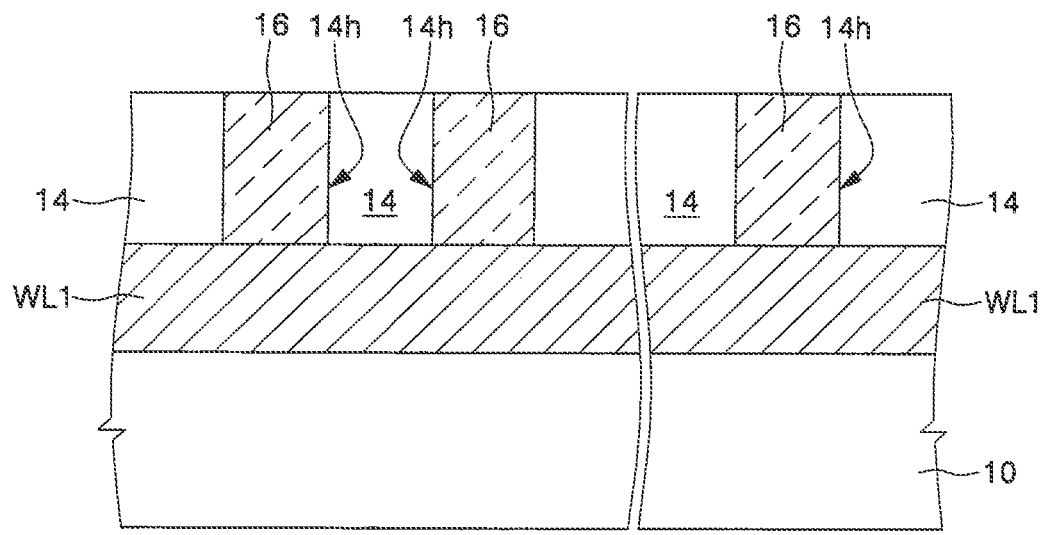
Figure 3B:
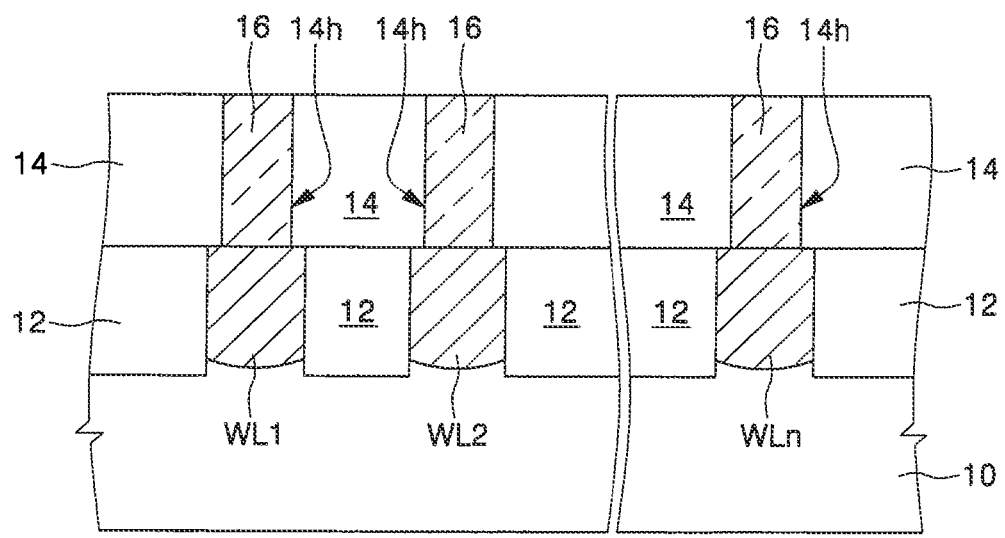

Referring to FIGS. 1, 3A and 3B, a first interlayer insulating layer 14 is formed on the semiconductor substrate 10 having the word lines WL1, WL2, . . . , and WLn and the word line separation layer 12. The first interlayer insulating layer 14 may be formed of a single layer of insulating material. The first interlayer insulating layer 14 is patterned to form cell diode holes 14h that expose predetermined regions of the word lines WL1, WL2, . . . , and WLn. The cell diode holes 14h may be two-dimensionally arranged when viewed from a top plan view.

A semiconductor layer filling the cell diode holes 14h are formed. The semiconductor layer may be formed using a selective epitaxial growth (SEG) technique that employs the word lines WL1, WL2, . . . , and WLn exposed by the cell diode holes 14h as seed layers. Accordingly, when the word lines WL1, WL2, . . . , and WLn have a single crystalline structure, the semiconductor layer may also have a single crystalline structure. Further, the semiconductor layer may be grown to have a higher top surface than a top surface of the first interlayer insulating layer 14. In this case, the semiconductor layer may be planarized to form semiconductor patterns 16 with flat surfaces that have the same level as the top surface of the first interlayer insulating layer 14. When the SEG process is performed using a silicon source gas, the semiconductor layer may be a silicon layer.

Alternatively, the semiconductor layer may be formed using a chemical vapor deposition (CVD) process. In this case, the semiconductor patterns 16 may be formed by planarizing the CVD semiconductor layer. The CVD semiconductor layer may be formed to have a polycrystalline structure. Accordingly, the carrier mobility in the CVD semiconductor layer may be less than that in the single crystalline semiconductor layer that is formed using the SEG technique. However, the CVD process may typically exhibit a relatively high process margin as compared to the SEG process. Therefore, when the semiconductor layer is formed using the CVD process, the throughput of fabrication can be improved.

Figure 4A:
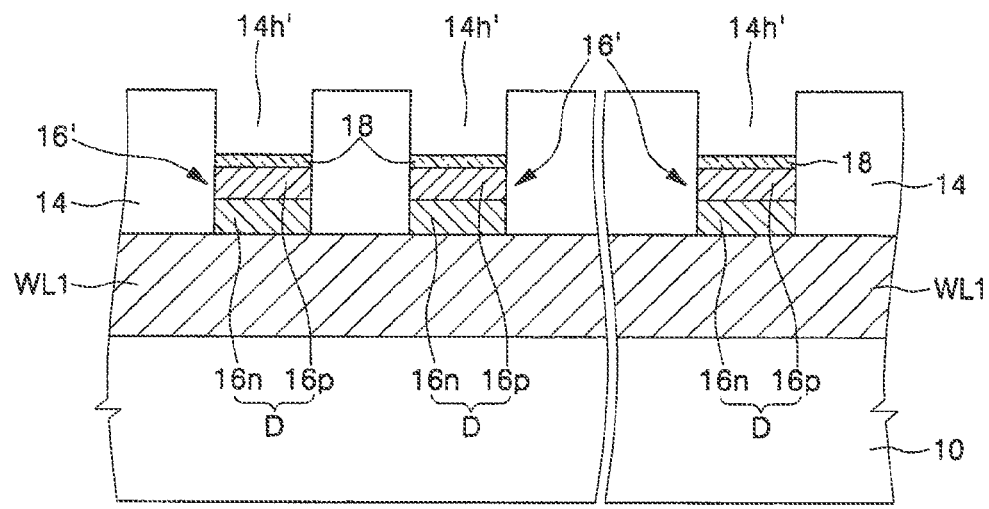
Figure 4B:
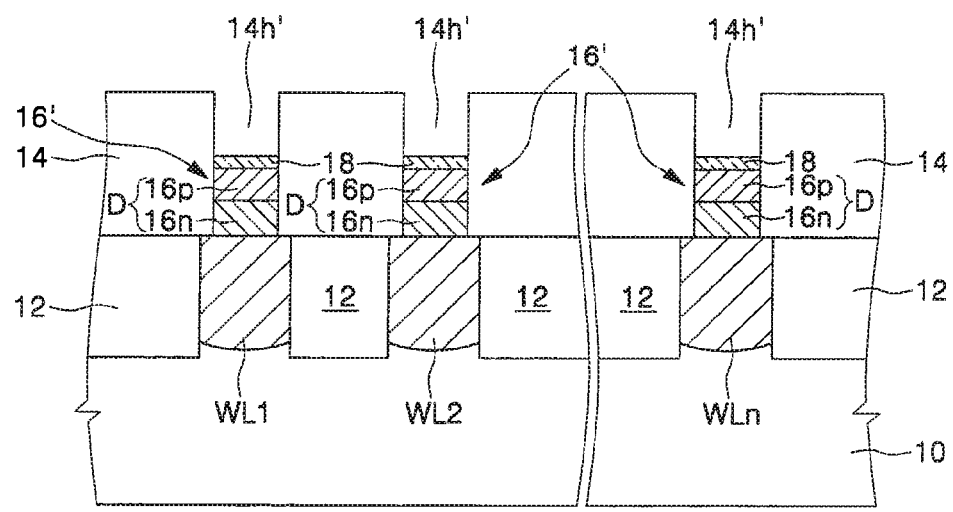

Referring to FIGS. 1, 4A and 4B, the semiconductor patterns 16 are partially etched to form recessed semiconductor patterns 16' having lower surfaces than the top surface of the first interlayer insulating layer 14. Impurity ions of the first or second conductivity type are implanted into lower regions of the recessed semiconductor patterns 16' to form first impurity regions, i.e., first semiconductor patterns 16n. Accordingly, the first semiconductor patterns 16n may be formed to have the first or second conductivity type. Impurity ions of the first conductivity type are then implanted into upper regions of the recessed semiconductor patterns 16' to form second impurity regions, i.e., second semiconductor patterns 16p. Accordingly, the second semiconductor patterns 16p may be formed to have the first conductivity type. The ion implantation process for forming the first semiconductor patterns 16n may be performed after the ion implantation process for forming the second semiconductor patterns 16p.

When the first semiconductor patterns 16n are doped with impurity ions of the second conductivity type, the first and second semiconductor patterns 16n and 16p sequentially stacked in each of the cell diode holes 14h constitute a cell diode D. Alternatively, when the first semiconductor patterns 16n are doped with impurity ions of the first conductivity type, the word lines WL1, WL2, . . . , and WLn and the first semiconductor patterns 16n constitute the cell diodes D.

Even though the first semiconductor patterns 16n are formed to have either the first conductivity type or the second conductivity type, the first semiconductor patterns 16n may be formed to have a lower impurity concentration than those of the word lines WL1, WL2, . . . , and WLn and the second semiconductor patterns 16p. This is for minimizing the leakage current that flow through the cell diodes D when the cell diodes D are reverse-biased.

Cell diode electrodes 18 are formed on the second semiconductor patterns 16p. The cell diode electrodes 18 may be formed of a metal silicide layer such as a cobalt silicide layer, a nickel silicide layer, or a titanium silicide layer. The metal silicide layer may be formed using a self-aligned silicide (salicide) technique well known in the art. The cell diode electrodes 18 may still be formed to have lower surfaces than the top surface of the first interlayer insulating layer 14. Accordingly, upper cell diode holes 14h' may be provided on the cell diode electrodes 18.

Figure 5A:
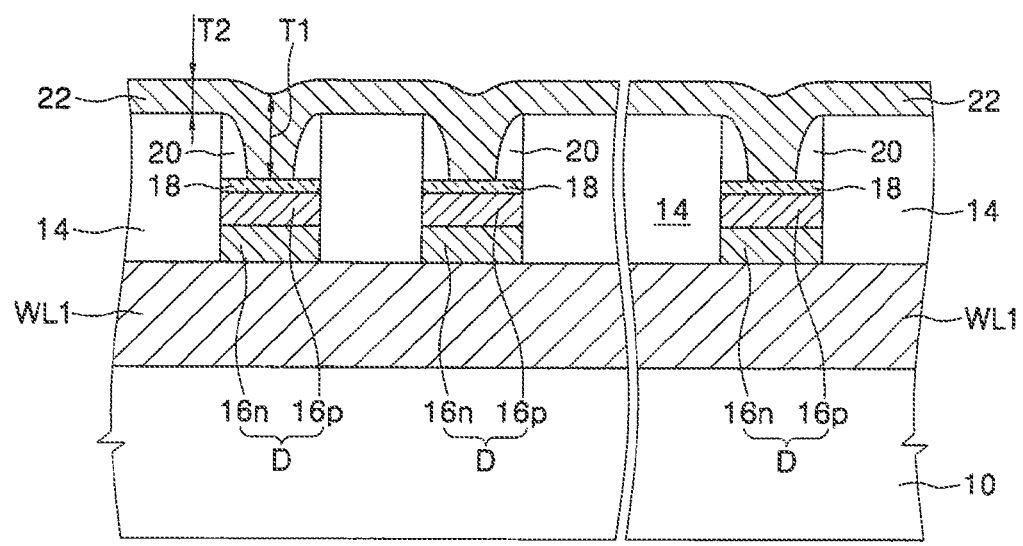
Figure 5B:
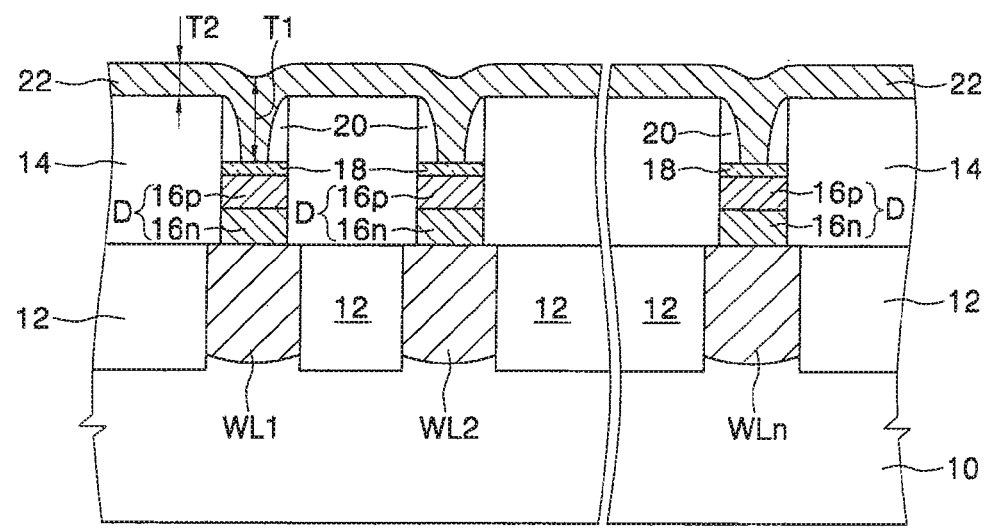

Referring to FIGS. 1, 5A and 5B, insulating contact spacers 20 may be formed on sidewalls of the upper cell diode holes (14h' of FIGS. 4A and 4B). The contact spacers 20 may be formed of an insulating layer such as a silicon nitride layer. In detail, the contact spacers 20 may be formed by forming an insulating layer on the semiconductor substrate 10 having the cell diode electrodes 18 and anisotropically etching the insulating layer. As a result, exposed areas of the cell diode electrodes 18 may be reduced. Further, a conductive layer 22 filling the upper cell diode holes 14h' may be formed on the semiconductor substrate 10 having the contact spacers 20. As a result, a first thickness T1 of the conductive layer 22 on the cell diode electrodes 18 may be greater than a second thickness T2 of the conductive layer 22 on the first interlayer insulating layer 14. The conductive layer 22 may be formed of a metal layer that does not react with a phase change material layer to be formed in a subsequent process. For example, the conductive layer 22 may be formed of a titanium nitride layer or a titanium aluminum nitride layer.

Figure 6A:
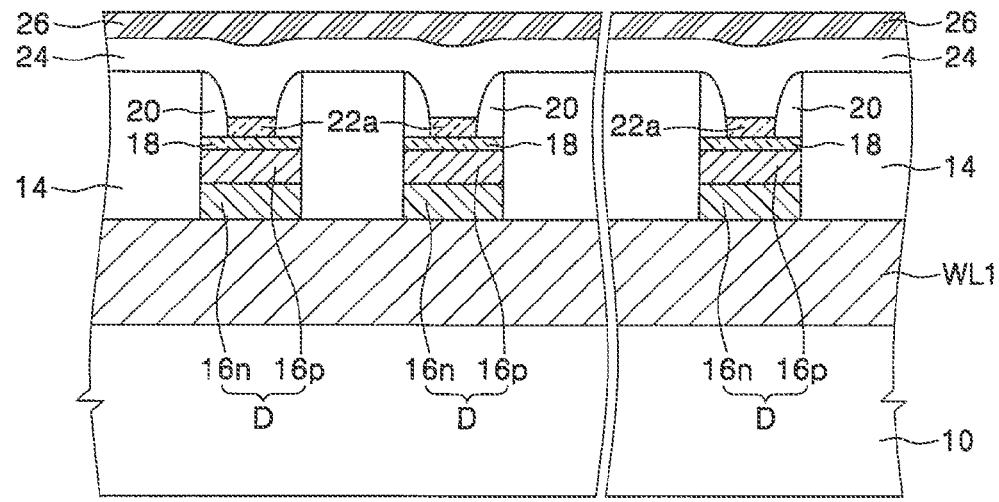
Figure 6B:
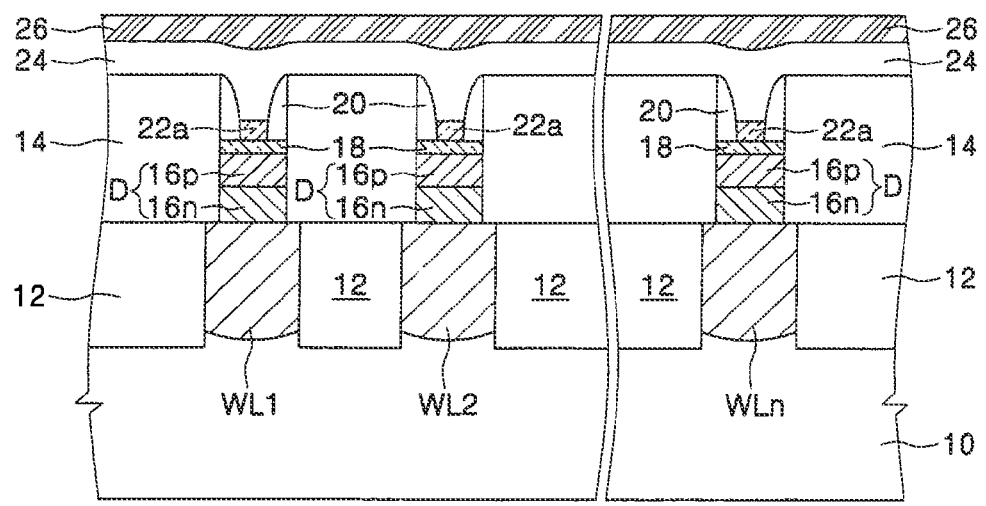

Referring to FIGS. 1, 6A and 6B, the conductive layer 22 is etched-back to form conductive layer patterns 22a, i.e., lower electrodes on the cell diode electrodes 18. The lower electrodes 22a are formed to have lower surfaces than the top surface of the first interlayer insulating layer 14. A phase change material layer 24 and an upper electrode layer 26 are sequentially formed on the semiconductor substrate 10 having the lower electrodes 22a. The phase change material layer is formed to fill the upper portion of the cell diode holes 14h'. The phase change material layer 24 may be formed of a chalcogenide layer such as a GST layer, and the upper electrode layer 26 may be formed of a titanium nitride layer or a titanium aluminum nitride layer that does not react with the phase change material layer 24.

Referring to FIGS. 1, 7A and 7B, the upper electrode layer 26 and the phase change material layer 24 are patterned to form phase change material patterns 24a and upper electrodes 26a on the phase change material patterns 24a. The phase change material patterns 24a may be formed to fill and cover the upper portion of the cell diode holes 14h'. The lower electrode 22a, the phase change material pattern 24a and the upper electrode 26a, which are sequentially stacked on each of the cell diode electrodes 18, constitute a phase change resistor Rp. As a result, the phase change material patterns 24a of the phase change resistors Rp are formed to have confined shapes.

Lower regions 24c of the confined phase change material patterns 24a (i.e., the confined phase change material patterns 24a in the upper portion of the cell diode holes 14h′) may be self-aligned with the cell diodes D by the cell diode holes 14h passing through the first interlayer insulating layer 14. Accordingly, the planar area of the phase change memory cell including the phase change resistor Rp and the cell diode D connected thereto can be minimized.

In the present embodiments, the lower electrodes 22a may be formed between the confined phase change material patterns 24a and the cell diode electrodes 18 as described above. Thus, the lower electrodes 22a can suppress the interaction between the confined phase change material patterns 24a and the cell diode electrodes 18. As a result, the lower electrodes 22a may prevent the properties of the phase change material patterns 24a from being degraded due to the cell diode electrodes 18.

A second interlayer insulating layer 28 is formed on the semiconductor substrate 10 having the phase change resistors Rp. The second interlayer insulating layer 28 is patterned to form bit line contact holes 28h that expose the upper electrodes 26a. A conductive layer such as a metal layer is formed on the semiconductor substrate 10 having the bit line contact holes 28h, and the conductive layer is patterned to form a plurality of bit lines, i.e., m-number of bit lines BL1, BL2, . . . , and BLm, which cover the bit line contact holes 28h. The bit lines BL1, BL2, . . . , and BLm may be formed to cross over the word lines WL1, WL2, . . . , and WLn. Also, the bit lines BL1, BL2, . . . , and BLm are electrically connected to the upper electrodes 26a through the bit line contact holes 28h.

According to the present invention as described above, cell diodes and confined phase change material patterns on the cell diodes are self-aligned with each other by cell diode holes passing through a first interlayer insulating layer. Thus, areas of phase change memory cells including the cell diodes and the confined phase change material patterns may be reduced to improve the integration density of a phase change memory device employing the phase change memory cells. Also, lower electrodes may be provided between the confined phase change material patterns and electrodes of the cell diodes. Accordingly, the lower electrodes may suppress the interaction between the confined phase change material patterns and the cell diode electrodes, thereby preventing the properties of the confined phase change material patterns from being degraded. As a result, embodiments of the present invention can provide high-performance and highly integrated phase change devices.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a semiconductor substrate;
a word line separation layer located directly on the semiconductor substrate having a first hole exposing a part of the semiconductor substrate;
a word line located directly on the substrate in the first hole between opposing parts of the word line separation layer;
a first interlayer insulating layer located directly on the word line separation layer and the word line, wherein the first interlayer insulating layer has a second hole exposing a predetermined portion of the word line;
a diode comprising a first crystalline portion and a second crystalline portion, the first crystalline portion located in the second hole directly on the second crystalline portion and the second crystalline portion located in the second hole directly on the word line and connected to the word line;
a cell electrode located directly on the diode and located in the second hole;
a lower electrode located directly on the cell electrode and located in the second hole;
a phase change material pattern extending into the second hole in contact with the lower electrode; and
an upper electrode located directly on the phase change material pattern.

2. The device according to claim 1, wherein the word line has a length in a horizontal direction and a width in a vertical direction, wherein the length is larger than the width.

3. The device according to claim 1, wherein the first crystalline portion has a first conductivity type opposite a second conductivity type of the second crystalline portion.

4. The device according to claim 3, wherein the second crystalline portion is a lower epitaxial layer and the first crystalline portion is an upper epitaxial layer.

5. The device according to claim 1, wherein the cell electrode is a metal silicide layer.

6. The device according to claim 1, further comprising an insulating contact spacer between the phase change material pattern and the first interlayer insulating layer.

7. The device according to claim 1, wherein the lower electrode is a titanium nitride layer or a titanium aluminum nitride layer.

8. The device according to claim 1, further comprising:
a second interlayer insulating layer on the first interlayer insulating layer; and
a bit line disposed on the second interlayer insulating layer and electrically connected to the upper electrode through a bit line contact hole penetrating the second interlayer insulating layer.

9. A semiconductor device, comprising:
a semiconductor substrate of a first conductivity type;
a word line located directly on the semiconductor substrate, the word line having a second conductivity type, the second conductivity type being different from the first conductivity type, the word line having a length extending in a horizontal direction and a width extending in a vertical direction, wherein the length is larger than the width and a top surface of the word line is substantially flat in the vertical direction;
a first interlayer insulating layer located directly on the word line, the first interlayer insulating layer having a hole that exposes a predetermined portion of the word line, wherein a diameter of the hole is substantially uniform;
a first semiconductor pattern located in the hole as a first epitaxial layer, wherein the first semiconductor pattern has the first conductivity type;
a second semiconductor pattern located in the hole and located directly on the word line as a second epitaxial layer, wherein the second semiconductor pattern has the second conductivity type and the first semiconductor pattern is located directly on the second semiconductor pattern;
a lower electrode located in the hole of the first interlayer insulating layer and electrically connected with the first semiconductor pattern;

a phase change material pattern extending into the hole in contact with the lower electrode; and an upper electrode formed on the phase change material pattern.

10. The device according to claim 9, further comprising:
a cell electrode located directly on the first semiconductor pattern and located in the hole.

11. The device according to claim 9, further comprising an insulating contact spacer between the phase change material pattern and the first interlayer insulating layer.

12. The semiconductor device of claim 9, further comprising a word line separation layer located directly on the semiconductor substrate having a second hole exposing a part of the semiconductor substrate, wherein the word line is located in the second hole between opposing parts of the word line separation layer, and wherein the first interlayer insulating layer is also located directly on the word separation layer.

13. A semiconductor device, comprising:
a semiconductor substrate;
a first interlayer insulating layer having a hole, wherein a diameter of the hole has the same width through the first interlayer insulating layer;
a word line located directly on the semiconductor substrate;
a diode located within the hole and comprising a first epitaxial layer of a first crystalline material of a first conductivity type and a second epitaxial layer of a second crystalline material of a second conductivity type opposite to the first conductive type, wherein the first epitaxial layer is located directly on the word line and the second epitaxial layer is located directly on the first epitaxial layer, and wherein the first epitaxial layer is electrically connected to the word line;
a lower electrode located in the hole of the first interlayer insulating layer and electrically connected to the diode;
a cell electrode located directly on the first epitaxial layer and located in the hole;
a phase change material pattern extending into the hole in contact with the cell electrode; and
an upper electrode located directly on the phase change material pattern.

14. The device according to claim 13, further comprising an insulating contact spacer between the phase change material pattern and the first interlayer insulating layer.

15. The semiconductor device of claim 13, further comprising a word line separation layer located directly on the semiconductor substrate having a second hole exposing a part of the semiconductor substrate, wherein the word line is located in the second hole between opposing parts of the word line separation layer, and wherein the first interlayer insulating layer is located directly on the word line and the word separation layer.

16. A semiconductor device, comprising:
a semiconductor substrate;
a word line separation layer located in the semiconductor substrate;
a word line located in the substrate, the word line being adjacent the word line separation layer;
a first interlayer insulating layer disposed on the word line separation layer and the word line, wherein the first interlayer insulating layer has a hole through to the word line;
a diode located on the word line in the hole, the diode having a sidewall which is in contact with the first interlayer insulating layer;
a cell electrode located on the diode in the hole;
a lower electrode directly located on the cell electrode, wherein a lower surface of the lower electrode is narrower than an upper surface of the cell electrode;
a phase change material pattern disposed in the hole, the phase change material pattern being in contact with the lower electrode; and
an upper electrode disposed on the phase change material pattern.

17. The device according to claim 16, further comprising an insulating contact spacer located on a sidewall of the hole and on the cell electrode.

18. The device according to claim 17, wherein the insulating contact spacer is formed between the first interlayer insulating layer and the lower electrode.

19. The device according to claim 16, wherein the phase change material pattern extends onto a top surface of the first insulating layer.

20. The device according to claim 16, wherein an area of the phase change material pattern in contact with the lower electrode has a third size, wherein the third size is greater than the first size and smaller than the second size.

* * * * *